US012745531B2

United States Patent
(12) United States Patent
Dai et al.

(10) Patent No.: US 12,745,531 B2
(45) Date of Patent: Sep. 22, 2026

(54) DISPLAY SUBSTRATE HAVING SUBPIXELS LOCATED AT VERTEXES AND CENTER LINES OF VIRTUAL QUADRILATERAL, DISPLAY DEVICE, AND DRIVING METHOD OF DISPLAY SUBSTRATE

(71) Applicants: Chengdu BOE Optoelectronics Technology Co., Ltd., Chengdu (CN); BOE TECHNOLOGY GROUP CO., LTD., Beijing (CN)

(72) Inventors: Weinan Dai, Beijing (CN); Dengyu Wang, Beijing (CN); Kening Zheng, Beijing (CN); Junyi Zhou, Beijing (CN); Danyang Ma, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 581 days.

(21) Appl. No.: 18/024,606

(22) PCT Filed: May 7, 2022

(86) PCT No.: PCT/CN2022/091553
§ 371 (c)(1),
(2) Date: Mar. 3, 2023

(87) PCT Pub. No.: WO2023/216040
PCT Pub. Date: Nov. 16, 2023

(65) Prior Publication Data
US 2024/0284741 A1 Aug. 22, 2024

(51) Int. Cl.
*H10K 59/35* (2023.01)
*H10K 59/131* (2023.01)

(52) U.S. Cl.
CPC ......... *H10K 59/353* (2023.02); *H10K 59/131* (2023.02)

(58) Field of Classification Search
CPC .. G06V 40/1318; H10K 59/65; H10K 59/352; H10K 59/353; G09G 2300/0443; G09G 2300/0452
See application file for complete search history.

(56) References Cited

U.S. PATENT DOCUMENTS

2008/0001525 A1* 1/2008 Chao .................... H10K 59/353 313/503
2012/0280958 A1 11/2012 Lee et al.
(Continued)

FOREIGN PATENT DOCUMENTS

CN 103681754 A 3/2014
CN 107968103 A 4/2018
(Continued)

*Primary Examiner* — Yuzhen Shen
(74) *Attorney, Agent, or Firm* — WHDA, LLP

(57) ABSTRACT

A display substrate and a driving method of the same, and a display device, relate to the technical field of displaying. The display substrate includes a plurality of island regions separated from each other, and hole regions located between adjacent island regions; wherein, each of the plurality of island regions comprises a plurality of subpixels, the plurality of subpixels include first subpixels, second subpixels and third subpixels; the first subpixels are located at four vertex positions of a virtual quadrilateral; the second subpixels and the third subpixels are located at positions of two center lines of the virtual quadrilateral, to separate adjacent first subpixels; each of the center lines is a connecting line between midpoints of a pair of opposite side edges of the virtual quadrilateral.

18 Claims, 9 Drawing Sheets

(56) References Cited

U.S. PATENT DOCUMENTS

| | | | | |
|---|---|---|---|---|
| 2019/0252469 | A1 | 8/2019 | Xiao et al. | |
| 2021/0191552 | A1* | 6/2021 | Bok | H10K 59/38 |
| 2021/0210523 | A1 | 7/2021 | Sui et al. | |
| 2021/0287610 | A1* | 9/2021 | Kim | G09G 3/3266 |
| 2021/0384270 | A1 | 12/2021 | Liu et al. | |
| 2021/0408161 | A1 | 12/2021 | Sui et al. | |
| 2022/0320467 | A1* | 10/2022 | Ye | H10K 50/852 |
| 2022/0406851 | A1* | 12/2022 | Lee | H10K 50/865 |
| 2023/0245620 | A1 | 8/2023 | Lee | |
| 2024/0062720 | A1* | 2/2024 | Ma | G09G 3/3233 |

FOREIGN PATENT DOCUMENTS

| | | | |
|---|---|---|---|
| CN | 109755412 | A | 5/2019 |
| CN | 109920334 | A | 6/2019 |
| CN | 110137206 | A | 8/2019 |
| CN | 110323259 | A | 10/2019 |
| CN | 110518036 | A | 11/2019 |
| CN | 111653595 | A | 9/2020 |
| CN | 113410259 | A | 9/2021 |

* cited by examiner

DISPLAY SUBSTRATE HAVING SUBPIXELS LOCATED AT VERTEXES AND CENTER LINES OF VIRTUAL QUADRILATERAL, DISPLAY DEVICE, AND DRIVING METHOD OF DISPLAY SUBSTRATE

TECHNICAL FIELD

The present disclosure relates to the technical field of displaying and more particularly, to a display substrate and a driving method of the same, and a display device.

BACKGROUND

An organic light-emitting diode (OLED) is an active light emitting display device, which has the advantages of self-illumination, wide viewing angle, high contrast, low power consumption, wide color gamut, light and thin, and being deformable.

With the continuous development of display technology, OLED technology is increasingly used in transparent display. The transparent display is a technology that can not only display the image, but also penetrate the scene on the opposite side of the screen. Transparent display technology can realize virtual reality/augmented reality (VR/AR) and screen camera and other display functions.

SUMMARY

The present disclosure provides a display substrate, including a plurality of island regions separated from each other, and hole regions located between adjacent island regions; and each of the plurality of island regions includes a plurality of subpixels, the plurality of subpixels include first subpixels, second subpixels and third subpixels: the first subpixels are located at four vertex positions of a virtual quadrilateral: the second subpixels and the third subpixels are located at positions of two center lines of the virtual quadrilateral, to separate adjacent first subpixels: each of the center lines is a connecting line between midpoints of a pair of opposite side edges of the virtual quadrilateral.

In an embodiment of the present disclosure, the two center lines include a first center line and a second center line: in the virtual quadrilateral, at least one of the second subpixels is arranged in sequence along the first center line, the third subpixels are located on the second center line and symmetrically arranged on two sides of the second subpixel.

In an embodiment of the present disclosure, in the virtual quadrilateral, the third subpixels are not adjacent to each other.

In an embodiment of the present disclosure, each of the second subpixels has at least a first long side and a first short side, the first long side is parallel to the first center line, and the first short side is parallel to the second center line; and/or, each of the third subpixels has at least a second long side and a second short side, the second long side is parallel to the first center line, and the second short side is parallel to the second center line.

In an embodiment of the present disclosure, shapes of the first subpixels are a square, and shapes of the second subpixels and the third subpixels are a rectangle:

wherein, one pair of opposite side edges of the square are parallel to the first center line, and the other pair of opposite side edges are parallel to the second center line.

In an embodiment of the present disclosure, two second subpixels and two third subpixels are provided in the virtual quadrilateral.

In an embodiment of the present disclosure, for the first subpixel and the second subpixel arranged adjacently, a side edge of the first subpixel close to the second subpixel is parallel to a side edge of the second subpixel close to the first subpixel; and/or, for the first subpixel and the third subpixel arranged adjacently, a side edge of the first subpixel close to the third subpixel is parallel to a side edge of the third subpixel close to the first subpixel; and/or, for the second subpixel and the third subpixel arranged adjacently, a side edge of the second subpixel close to the third subpixel is parallel to a side edge of the third subpixel close to the second subpixel.

In an embodiment of the present disclosure, shapes of the plurality of subpixels include at least one of: a polygon, an oval, a sector, a kidney shape and a runway shape.

In an embodiment of the present disclosure, a minimum distance between two adjacent subpixels is greater than or equal to 10 μm, and less than or equal to 30 μm.

In an embodiment of the present disclosure, the first subpixels are green subpixels, the second subpixels are blue subpixels, and the third subpixels are red subpixels; or, the first subpixels are the green subpixels, the second subpixels are the red subpixels, and the third subpixels are the blue subpixel.

In an embodiment of the present disclosure, an area of the red subpixels is greater than or equal to an area of the green subpixels, and less than or equal to an area of the blue subpixels.

In an embodiment of the present disclosure, a ratio of the area of the red subpixels, the area of the green subpixels and the area of the blue subpixels is 2:1.5:5.

In an embodiment of the present disclosure, the island region includes one virtual quadrilateral; or, the island region includes a plurality of virtual quadrilaterals, the plurality of virtual quadrilaterals are arranged along a row direction and/or a column direction, and two adjacent virtual quadrilaterals share one side edge.

In an embodiment of the present disclosure, a shape of the island region is a quadrangle, for the subpixel disposed close to a vertex of the quadrangle, an apex angle close to the vertex of the quadrangle is a chamfer, and an apex angle of the quadrangle is a chamfer.

In an embodiment of the present disclosure, the display substrate further includes a bridge region connecting adjacent island regions, each of the plurality of subpixels is provided with a light-emitting device and a drive circuit: the drive circuit is electrically connected to the light-emitting device and signal lines, and configured to drive the light-emitting device to emit light according to signals provided by the signal lines; and the signal lines are disposed within a range of the bridge region.

In an embodiment of the present disclosure, the bridge region includes a first bridge region and a second bridge region, the first bridge region connects two adjacent island regions in a first direction, and the second bridge region connects two adjacent island regions in a second direction;

the signal lines include first signal lines and second signal lines, the first signal lines extend along the first direction, and the second signal lines extend along the second direction; and the first signal lines connected to the drive circuits in a same island region are located in different layers and overlapped with each other in a range of the first bridge region: the second signal lines connected to the drive circuits in a same island region are located in different layers and overlapped with each other in a range of the second bridge region.

In an embodiment of the present disclosure, the first signal lines connected to the drive circuits in the same island region are completely overlapped in the second direction: the second signal lines connected to the drive circuits in the same island region are completely overlapped in the first direction; wherein the first direction is perpendicular to the second direction.

In an embodiment of the present disclosure, materials of the signal lines include transparent metal oxide or metal.

The present disclosure provides a display device, including any one of the above described display substrate.

The present disclosure provides a driving method of a display substrate, applied to any one of the above described display substrate, and the driving method includes:

driving each of the first subpixels to emit light independently, to form four white pixels in the virtual quadrilateral, wherein each of the white pixels includes one of the first subpixels, one of the second subpixels and one of the third subpixels, and two adjacent white pixels share the second subpixel and/or the third subpixel.

The above description is merely a summary of the technical solutions of the present disclosure. In order to more clearly know the technological means of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the drawings that are required to describe the embodiments or the related art will be briefly described below. Apparently, the drawings that are described below are merely embodiments of the present disclosure, and a person skilled in the art may obtain other drawings according to these drawings without paying creative work.

DETAILED DESCRIPTION

In order to make the purpose, technical solutions and advantages of the embodiments of the present disclosure clearer, the technical solutions in the embodiments of the present disclosure will be described clearly and completely in combination with the drawings in the embodiments of the present disclosure. Obviously, the described embodiments are part of the embodiments of the present disclosure, not all of them. Based on the embodiments in the present disclosure, all other embodiments obtained by those skilled in the art without creative work fall within the scope of protection in the present disclosure.

Figure 1:
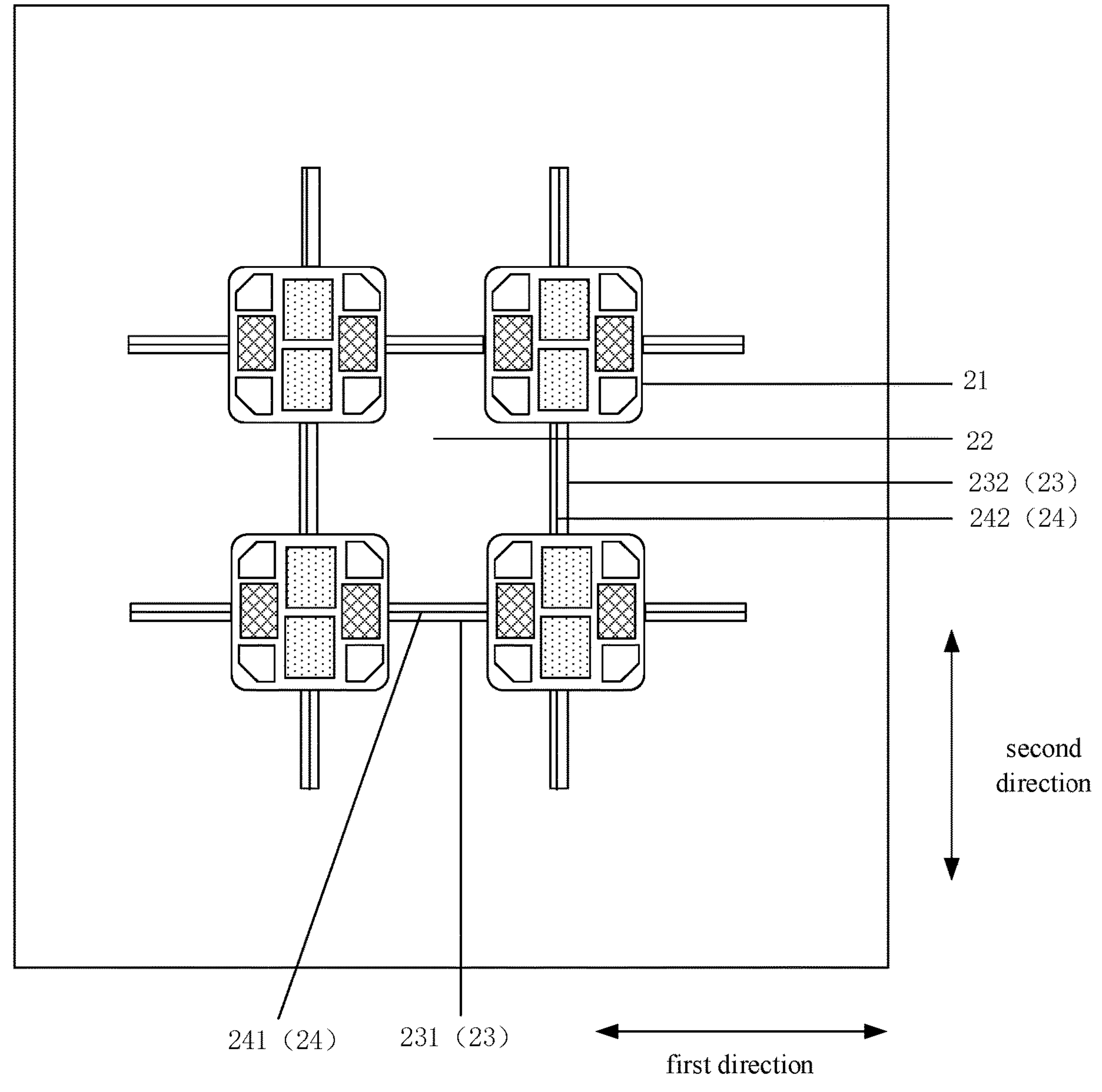
FIG. 1 illustrates a schematic diagram of a plane structure of a display substrate according to the present disclosure.

The present disclosure provides a display substrate, referring to FIG. 1. FIG. 1 illustrates a schematic diagram of a plane structure of the display substrate according to the present disclosure. As shown in FIG. 1, a transparent active area of the display substrate includes a plurality of island regions 21 separated from each other, and hole regions 22 located between adjacent island regions 21. The island regions 21 are used for displaying images, and the hole regions 22 are used for transmitting ambient light.

Figure 2:
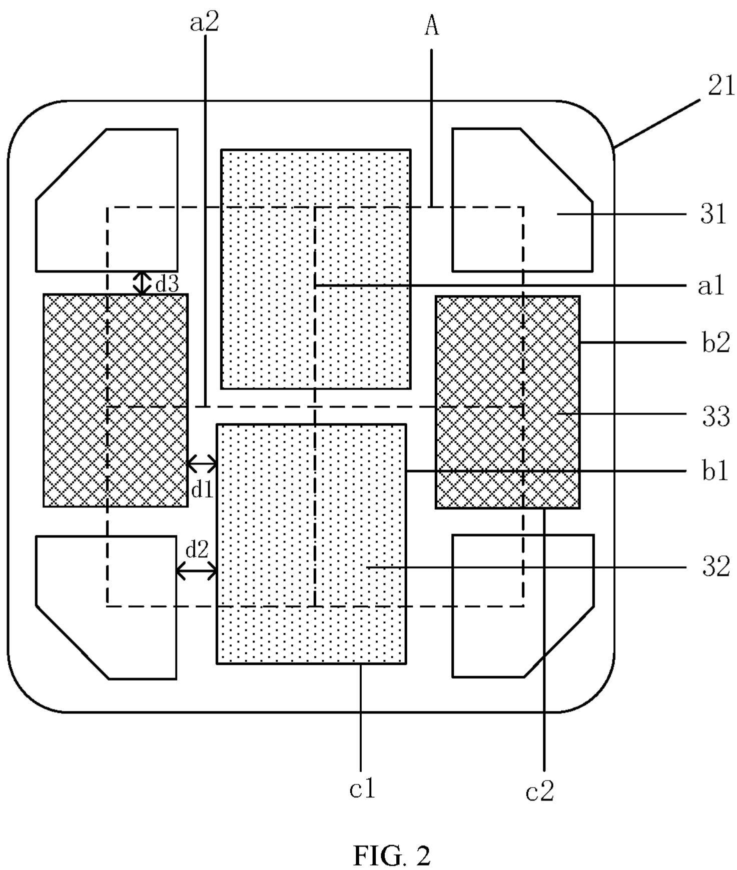
FIG. 2 illustrates a schematic diagram of a pixel structure of a first display substrate according to the present disclosure.
Figure 3:
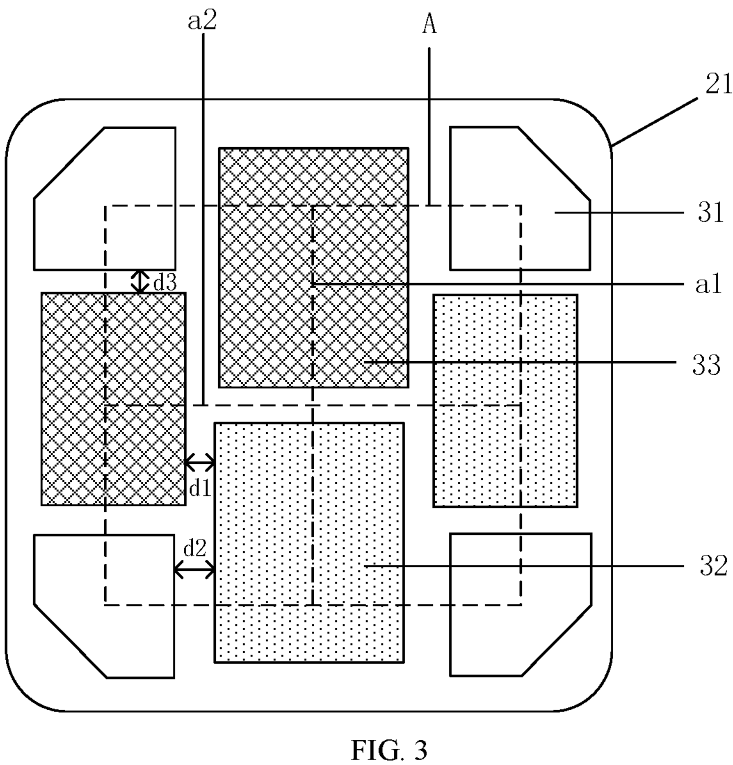
FIG. 3 illustrates a schematic diagram of a pixel structure of a second display substrate according to the present disclosure.

Referring to FIG. 2 and FIG. 3, which illustrate schematic diagrams of pixel structures of two display substrates according to the present disclosure. As shown in FIG. 2 and FIG. 3, each of the plurality of island regions 21 may include a plurality of subpixels, the plurality of subpixels include first subpixels 31, second subpixels 32 and third subpixels 33.

Among them, the first subpixels 31 are located at four vertex positions of a virtual quadrilateral A: the second subpixels 32 and the third subpixels 33 are located at positions of two center lines of the virtual quadrilateral A, to separate adjacent first subpixels 31.

Each vertex of the virtual quadrilateral A is provided with a first subpixel 31. The vertex of the virtual quadrilateral A may be located at any position within the range of the first subpixel 31 at this position. It is not limited to that the vertex of the virtual quadrilateral A is the center of the first subpixel 31.

The second subpixels 32 and the third subpixels 33 are located at the center lines of the virtual quadrilateral A, which means that the center lines pass through any position within the range of the second subpixel 32 and the third subpixel 33, or at least one of the layout directions of the second subpixel 32 and the third subpixel 33 is roughly along the extension direction of the center lines.

Each of the center lines is a connecting line between midpoints of a pair of opposite side edges of the virtual quadrilateral. As shown in FIG. 2 and FIG. 3, the two center lines of the virtual quadrilateral A include a first center line a1 and a second center line a2.

In the present disclosure, by arranging the first subpixels 31 at the vertex positions of the virtual quadrilateral A. and arranging the second subpixels 32 and the third subpixels 33 at the positions of the first center line a1 and the second center line a2 of the virtual quadrilateral A, respectively, any two first subpixels 31 are separated. That is, any two first subpixels 31 are separated by the second subpixel 32 and/or the third subpixel 33, which can ensure that in the virtual quadrilateral A, any two first subpixel 31 are not adjacent to each other, thus avoiding the centralized setting of the first subpixels 31, and improving the dispersity of the first subpixel 31.

Figure 5:
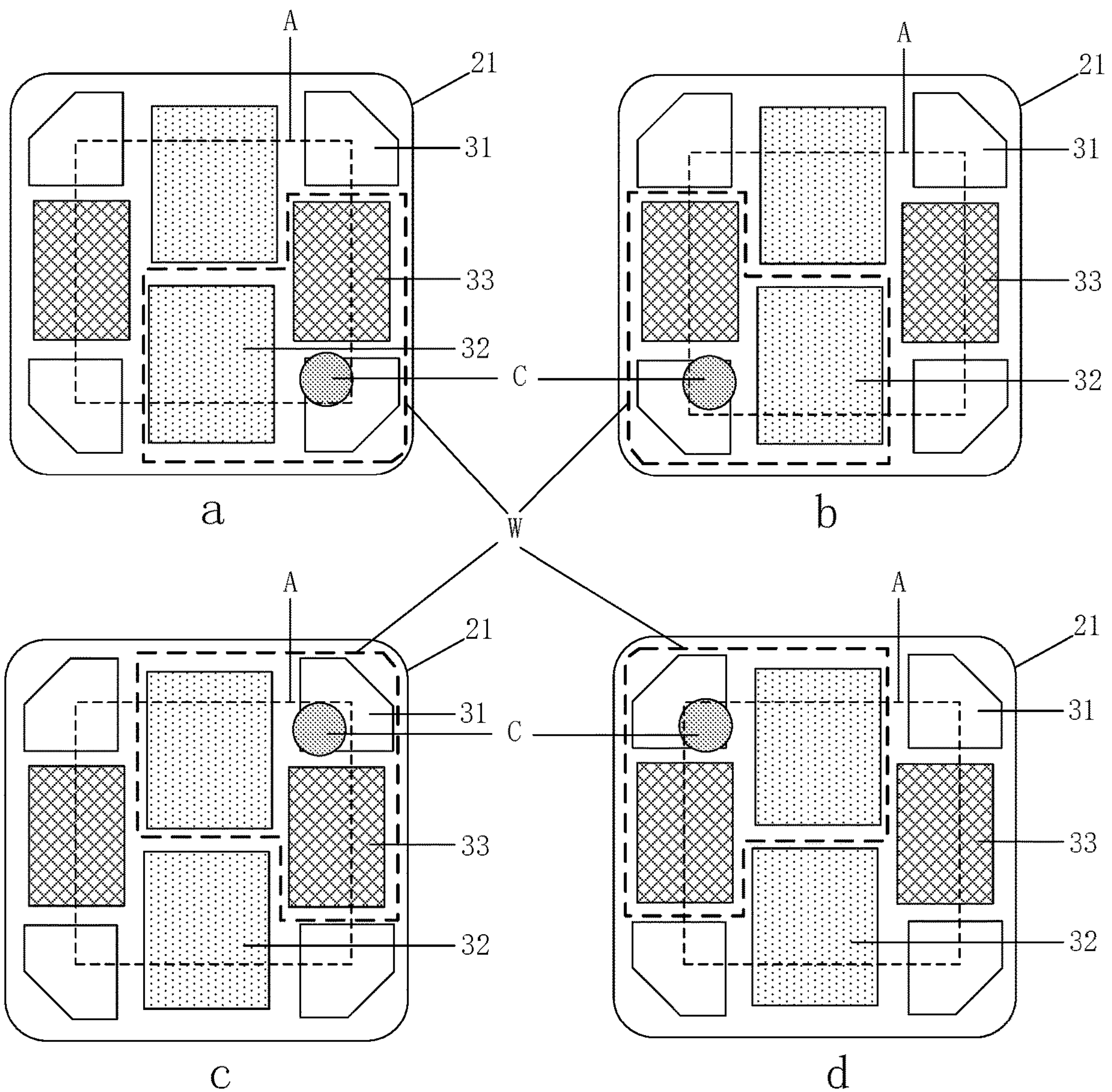
FIG. 5 illustrates a schematic structural diagram of a white pixel in a first display substrate according to the present disclosure.

In the specific implementation, for each first subpixel 31, the first subpixel 31 and one surrounding second subpixel 32 and third subpixel 33 form a white pixel W. In this way, four white pixels W may be formed in the virtual quadrilateral A (shown in FIG. a, FIG. b, FIG. c and FIG. d in FIG. 5, respectively). FIG. 5 shows the schematic diagram of the white pixels composed of multiple subpixels in the same virtual quadrilateral. The pixel structure of the virtual quadrilateral is shown in FIG. 2.

During the display process, the luminance center of each white pixel W forms a white luminance center C (as shown in FIG. 5).

For the display substrate provided by the present disclosure, since the spacings between the first subpixels 31 are large and the first subpixels 31 are distributed relatively scattered in the virtual quadrilateral A, the first subpixels 31 may be set as a color subpixel (such as a green subpixel, etc.) with strong human eye perception or high human eye sensitivity. Because the dispersity of the first subpixels 31 is high, the dispersity of the white luminance centers C formed by the mixing of the first subpixels 31, and the second subpixels 32 and the third subpixels 33 that are in the island region 21 is also improved, which improves the distribution uniformity of the white luminance centers C in the island region 21, and avoids the local aggregation of the white luminance centers C in the island region 21, which is equivalent to increasing the number of the white brightness centers C in the island region 21, thus improving the fineness of the display image.

Figure 6:
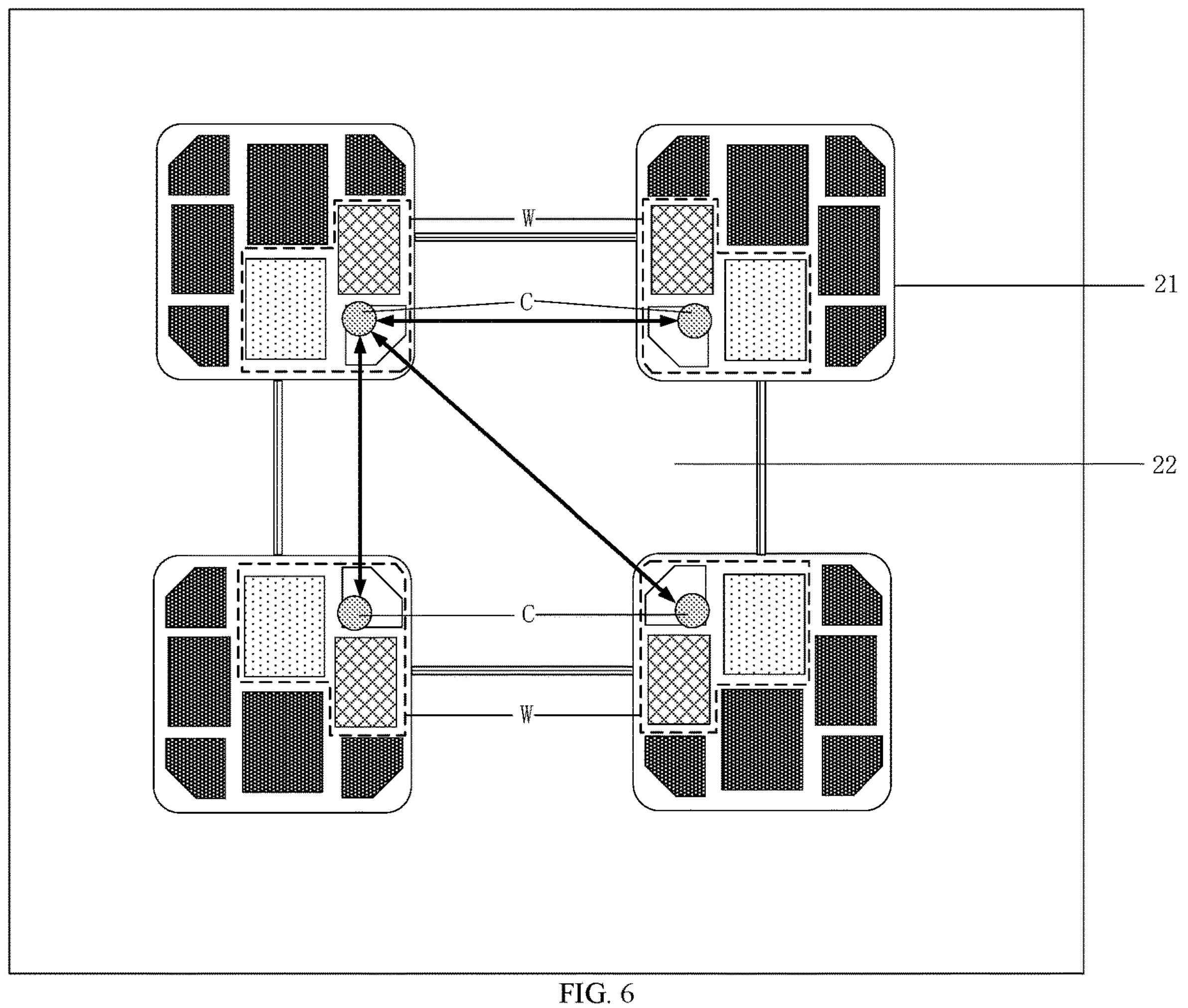
FIG. 6 illustrates a distribution schematic diagram of white luminance centers in a first display substrate according to the present disclosure.

In addition, because the distribution of the white luminance centers C in the island region 21 is more uniform, and the white luminance centers C are also distributed at the edge of the island region 21, the spacing between two white luminance centers C that are respectively located on the adjacent island regions 21 can be reduced (as shown in FIG. 6), thus reducing the dark area spacing between adjacent island regions 21 and reducing the graininess of the display image.

FIG. 6 illustrates a distribution schematic diagram of the white luminance centers in several adjacent island regions, and the pixel structure of each island region is shown in FIG. 2.

As shown in FIG. 5, in the virtual quadrilateral A, each first subpixel 31 can be driven independently, and each first subpixel 31 corresponds to a white pixel W.

Each white pixel W in the virtual quadrilateral A may independently include a first subpixel 31.

The second subpixel 32 and/or the third subpixel 33 can be shared between two adjacent white pixels W in the virtual quadrilateral A.

Specifically, the two white pixels W corresponding to the two adjacent first subpixels 31 can share the second subpixel 32 or the third subpixel 33 between the two adjacent first subpixels 31.

For example, in the virtual quadrilateral A, the white pixel W in the lower right corner (as shown in FIG. a in FIG. 5) and the white pixel W in the lower left corner (as shown in FIG. b in FIG. 5) share the second subpixel 32 between the first subpixel 31 in the lower right corner and the first subpixel 31 in the lower left corner.

In the virtual quadrilateral A, the white pixel W in the upper right corner (as shown in FIG. c in FIG. 5) and the white pixel W in the upper left corner (as shown in FIG. d in FIG. 5) share the second subpixel 32 between the first subpixel 31 in the upper right corner and the first subpixel 31 in the upper left corner.

In the virtual quadrilateral A, the white pixel W in the lower right corner (as shown in FIG. a in FIG. 5) and the white pixel W in the upper right corner (as shown in FIG. c in FIG. 5) share the third subpixel 33 between the first subpixel 31 in the lower right corner and the first subpixel 31 in the upper right corner.

In the virtual quadrilateral A, the white pixel W in the lower left corner (as shown in FIG. b in FIG. 5) and the white pixel W in the upper left corner (as shown in FIG. d in FIG. 5) share the third subpixel 33 between the first subpixel 31 in the lower left corner and the first subpixel 31 in the upper left corner.

In order to drive the subpixel in the transparent active area to emit light and display, the following two solutions can be adopted: a built-in drive circuit and an external drive circuit. Among them, the external drive circuit specifically refers to setting the light-emitting device of the subpixel in the transparent active area, and setting the drive circuit that drives the light-emitting device outside the transparent active area. The built-in drive circuit specifically refers to setting the light-emitting device and the drive circuit that drives the light-emitting device to glow inside the transparent active area.

Optionally, the display substrate provided by the present disclosure can adopt the solution of the built-in drive circuit, thus simplifying the structural design and reducing the cost.

In related art, when the built-in drive circuit is used in the transparent active area, the transmittance of ambient light is usually improved by reducing the pixel density of the transparent active area. However, reducing the pixel density causes the distance between monochrome subpixels to increase, which leads to some difficulties in light mixing between the monochrome subpixels.

In the present disclosure, the transparent active area is designed as an island structure, that is, the transparent active area includes a plurality of island regions 21 separated from each other and the hole regions 22 located around the island regions 21. In this way, on the one hand, it is not necessary to reduce the pixel density in the island regions 21, and which may reduce the distance between multiple subpixels in the island regions 21, so that different colors can be freely mixed among the subpixels with different colors to improve the display effect: on the other hand, because the hole regions 22 may allow the ambient light to penetrate, it can improve the ambient light transmittance of the transparent active area, improve the transparency and clarity of the transparent active area, and improve the photographing effect of the camera under the screen.

It should be noted that the display substrate provided by the present disclosure can also adopt solution of the external drive circuit in the transparent active area, which can further improve the ambient light transmittance of the transparent active area, at the same time, it is not necessary to reduce the pixel density of the transparent active area, which may improve the display effect of the transparent active area. When the solution of the external drive circuit is adopted, transparent wirings can be used to connect the light-emitting devices of the subpixels and the external drive circuit, so as to reduce the influence of the wirings on the transmission rate of the transparent active area.

In the specific implementation, there are many ways to realize that the second subpixels 32 and the third subpixels 33 are located at the positions of the two center lines of the virtual quadrilateral A.

In an optional implementation mode, at least one second subpixel 32 and at least one third subpixel 33 are arranged in sequence along the first center line a1, and at least one second subpixel 32 and at least one third subpixel 33 are arranged in sequence along the second center line a2. As shown in FIG. 3, one second subpixel 32 and one third subpixel 33 are arranged in sequence on the first center line a1, and one second subpixel 32 and one third subpixel 33 are arranged in sequence on the second center line a2.

In the structure shown in FIG. 3, because the two third subpixels 33 are adjacent and centrally arranged at the upper left corner of the virtual quadrilateral A, and the two second subpixels 32 are adjacent and centrally arranged at the lower right corner of the virtual quadrilateral A, this structure is prone to poor edge color deviation.

In another alternative implementation mode, as shown in FIG. 2, at least one second subpixel 32 and a plurality of third subpixels 33 are arranged in the virtual quadrilateral A, and at least one second subpixel 32 is arranged along the first center line a1, and the plurality of third subpixels 33 are located on the second center line a2 and symmetrically arranged on two sides of the second subpixel 32.

Because the second subpixels 32 are arranged in sequence along the first center line a1, the third subpixels 33 are arranged on the second center line a2 and symmetrically distributed on two sides of the second subpixel 32, that is, the second subpixels 32 are arranged close to the middle of the virtual quadrilateral A, and the third subpixels 33 are arranged close to the edge of the virtual quadrilateral A. Therefore, it can avoid the edge color deviation problem that may arise from arranging the second subpixels 32 and the third subpixels 33 close to the edge of the virtual quadrilateral A at the same time.

Because the third subpixels 33 are arranged on two sides of the second subpixel 32, the dispersity of the third subpixels 33 is high, which can avoid the color deviation caused by the centralized setting of the third subpixels 33. In this case, the third subpixels 33 can be set as a color subpixel (such as a red subpixel) with higher human eye sensitivity than the second subpixel 32, which can further avoid the problem of edge color and reduce color deviation.

Because the second subpixels 32 are arranged in the middle of the virtual quadrilateral A, and the setting of the second subpixels 32 is relatively centralized, the second subpixels 32 can be set as a color subpixel with relatively low human eye sensitivity (such as a blue subpixel), which can improve the color mixing effect.

Optionally, in the virtual quadrilateral A, the plurality of third subpixels 33 are not adjacent to each other.

By setting the plurality of third subpixels 33 not adjacent to each other, as shown in FIG. 2, that is, any two third subpixels 33 are separated by the second subpixel 32, which can further improve the dispersity of the third subpixels 33 and further improve the edge color deviation.

Optionally, as shown in FIG. 2, each of the second subpixels 32 has at least a first long side b1 and a first short side c1, the first long side b1 is parallel to the first center line a1, and the first short side c1 is parallel to the second center line a2.

Figure 9:
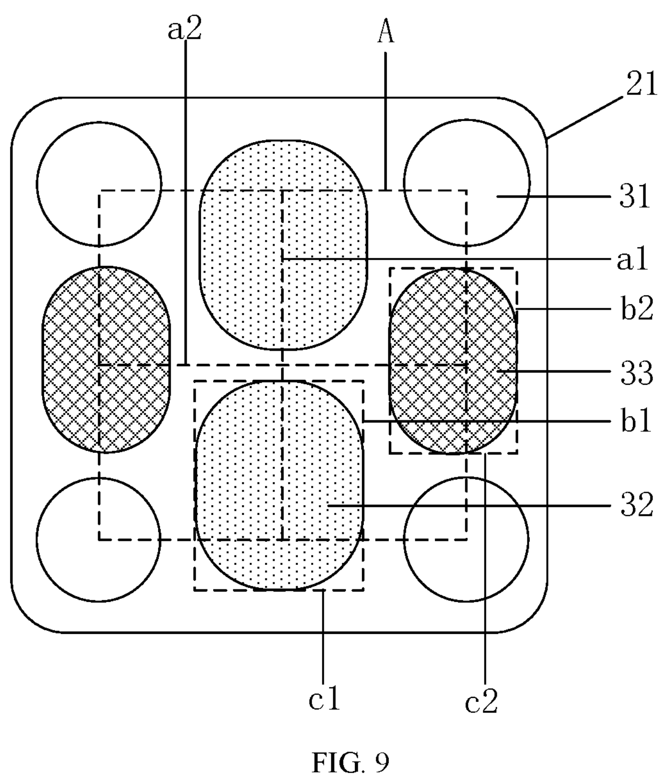
FIG. 9 illustrates a schematic diagram of a pixel structure of a sixth display substrate according to the present disclosure.

When the shape of second subpixel 32 is a rectangle, the first long side b1 is the long side of the rectangle, and the first short side c1 is the short side of the rectangle, as shown in FIG. 2. When the shape of the second subpixel 32 is a parallelogram, the first long side b1 is the long side of the parallelogram, and the first short side c1 is the short side of the parallelogram. When the shape of the second subpixel 32 is an oval, a kidney shape or a runway shape, as shown in FIG. 9, the first long side b1 is the long side of the smallest circumscribed rectangle of the oval, the kidney shape or the runway shape, and the first short side c1 is the short side of the smallest circumscribed rectangle of the oval, the kidney shape or the runway shape.

Each of the third subpixels 33 has at least a second long side b2 and a second short side c2, the second long side b2 is parallel to the first center line a1, and the second short side c2 is parallel to the second center line a2.

When the shape of the third subpixels 33 is a rectangle, the second long side b2 is the long side of the rectangle, and the second short side c2 is the short side of the rectangle, as shown in FIG. 2. When the shape of the third subpixels 33 is a parallelogram, the second long side b2 is the long side of the parallelogram, and the second short side c2 is the short side of the parallelogram. When the shape of the third subpixels 33 is an oval, a kidney shape or a runway shape, as shown in FIG. 9, the second long side b2 is the long side of the smallest circumscribed rectangle of the oval, the kidney shape or the runway shape, and the second short side c2 is the short side of the smallest circumscribed rectangle of the oval, the kidney shape or the runway shape.

Optionally, the shape of the second subpixel 32 is the rectangle, which is not limited in the present disclosure.

Optionally, the shape of the third subpixel 33 is the rectangle, which is not limited in the present disclosure.

Optionally, the shape of the first subpixel 31 is a square. One pair of opposite side edges of the square are parallel to the first center line a1, and the other pair of opposite side edges are parallel to the second center line a2.

Among them, the rectangle may be a chamfer rectangle or a non-chamfer rectangle. The square may be a chamfer square or a non-chamfer square, which is not limited in the present disclosure.

Optionally, two second subpixels 32 and two third subpixels 33 are provided in the virtual quadrilateral A, which is not limited in the present disclosure.

Optionally, as shown in FIG. 2 and FIG. 3, for the first subpixel 31 and the second subpixel 32 arranged adjacently, a side edge of the first subpixel 31 close to the second subpixel 32 is parallel to a side edge of the second subpixel 32 close to the first subpixel 31.

Optionally, as shown in FIG. 2 and FIG. 3, for the first subpixel 31 and the third subpixel 33 arranged adjacently, a side edge of the first subpixel 31 close to the third subpixel 33 is parallel to a side edge of the third subpixel 33 close to the first subpixel 31.

Optionally, as shown in FIG. 2 and FIG. 3, for the second subpixel 32 and the third subpixel 33 arranged adjacently, a side edge of the second subpixel 32 close to the third subpixel 33 is parallel to a side edge of the third subpixel 33 close to the second subpixel 32.

Optionally, shapes of the plurality of subpixels include at least one of: regular or irregular shapes such as a polygon, an oval, a sector, a kidney shape and a runway shape. The polygon may include a triangle, a rectangle, a square, a diamond, a trapezoid, a parallelogram, a pentagon, a hexagon and an octagon. The present disclosure does not limit the shape of each subpixel.

For example, as shown in FIG. 2 to FIG. 4 and FIG. 7 to FIG. 8, the shapes of the first subpixels 31, the second subpixels 32 and the third subpixels 33 are all polygon, or the polygon with chamfers. The shapes of the first subpixels 31 is the square, the shapes of the second subpixels 32 and the third subpixels 33 are the rectangular.

For example, as shown in FIG. 9, the first subpixels 31 are circular, the shapes of the second subpixels 32 and the third subpixels 33 are the runway shape.

Figure 10:
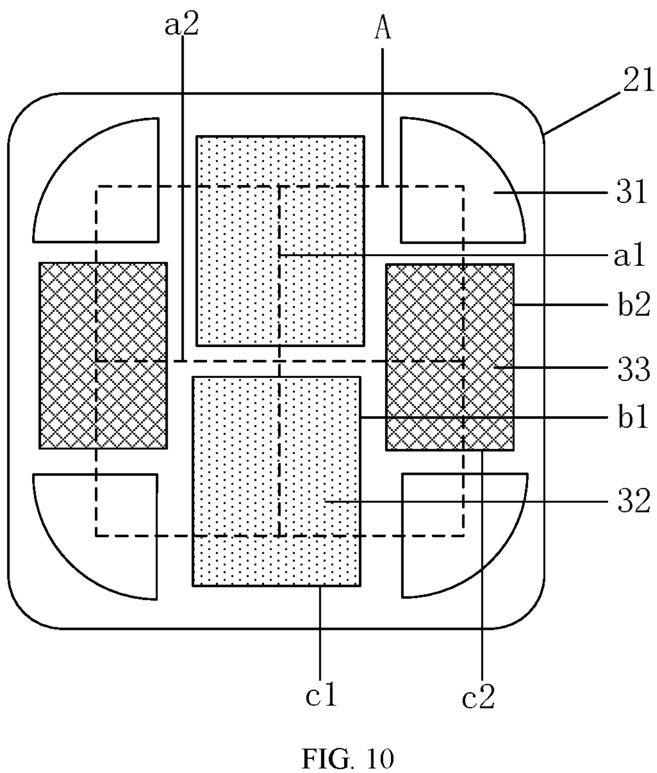
FIG. 10 illustrates a schematic diagram of a pixel structure of a seventh display substrate according to the present disclosure.

For example, as shown in FIG. 10, the first subpixels 31 are the sector, the shapes of the second subpixels 32 and the third subpixels 33 are the rectangle.

Figure 11:
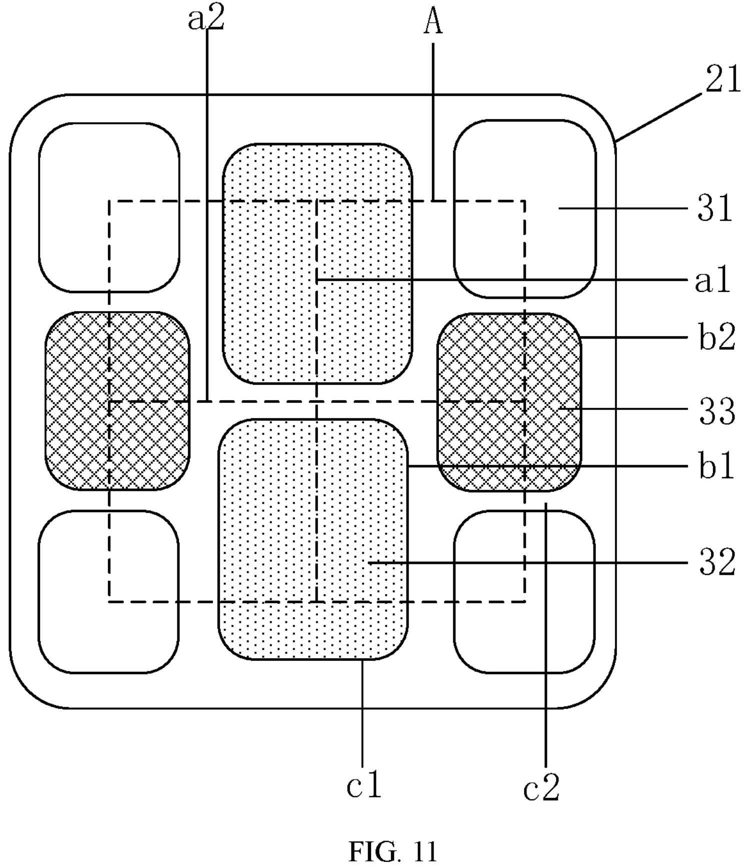
FIG. 11 illustrates a schematic diagram of a pixel structure of an eighth display substrate according to the present disclosure.

For example, as shown in FIG. 11, the shapes of the first subpixels 31, the second subpixels 32 and the third subpixels 33 are the rectangle.

For example, as shown in FIG. 2, the shapes of the four first subpixels 31 are the square. The shapes of the second subpixels 32 and the third subpixels 33 are the rectangle, with long sides and short sides.

Among them, one side edge of the first subpixel 31 is adjacent to and parallel to the long side of the second subpixel 32, and another side edge of the first subpixel 31 is adjacent to and parallel to the short side of the third subpixel 33. The long side of the third subpixel 33 is adjacent to and parallel to the long side of the second subpixel 32. The short edges of the two second subpixels 32 are adjacent and parallel to each other. The long side of the first side (such as the left side) of the second subpixel 32 is adjacent to one first subpixel 31 and one third subpixel 33 at the first side, and the long side of the second side (such as the right side) of the second subpixel 32 is adjacent to one first subpixel 31 and one third subpixel 33 at the second side.

Optionally, a minimum distance between two adjacent subpixels is greater than or equal to 10 μm, and less than or equal to 30 μm. Furthermore, the minimum distance between the two adjacent subpixels may be greater than or equal to 15 μm, and less than or equal to 20 μm.

It should be noted that the minimum distance between two subpixels refers to the minimum distance between the opening areas of the two subpixels. Among them, the open area of each subpixel can be formed by the pixel definition layer.

As shown in FIG. 2 and FIG. 3, the minimum distance between two adjacent subpixels includes: the minimum distance d1 between the second subpixel 32 and the third subpixel 33, the minimum distance d2 between the first subpixel 31 and the second subpixel 32, and the minimum distance d3 between the first subpixel 31 and the third subpixel 33.

For example, the minimum distance d1 between the second subpixel 32 and the third subpixel 33 may be greater than or equal to 15 μm and less than or equal to 20 μm. The minimum distance d2 between the first subpixel 31 and the second subpixel 32 may be greater than or equal to 15 μm and less than or equal to 20 μm. The minimum distance d3 between the first subpixel 31 and the third subpixel 33 may be greater than or equal to 15 μm and less than or equal to 20 μm.

Optionally, the first subpixels 31 are green subpixels, the second subpixels 32 are blue subpixels, and the third subpixel 33 are red subpixels.

Optionally, the first subpixels 31 are the green subpixels, the second subpixels 32 are the red subpixels, and the third subpixels 33 are the blue subpixel.

In the pixel structure shown in FIG. 2, because the dispersity of the first subpixel 31 is the largest, the dispersity of the second subpixel 32 is the smallest, and the sensitivity of the human eye to the green subpixel is the largest, and the sensitivity of the human eye to the blue subpixel is the smallest, when the first subpixel 31 is set as the green subpixel, the second subpixel 32 is set as the blue subpixel, and the third subpixel 33 is set as the red subpixel, the display effect can be further improved and the edge color deviation problem can be improved. Optionally, an area of the red subpixels is greater than or equal to an area of the green subpixels, and less than or equal to an area of the blue subpixels.

Because the life of the blue light-emitting device decays quickly and the luminous efficiency is low, the luminous efficiency of the blue subpixels can be improved by setting a large area of the blue subpixels, and the service life of the display substrate can be extended.

For example, the ratio among the area of the red subpixels, the area of the green subpixels and the area of the blue subpixels can be 2:1.5:5, which is not limited in the present disclosure.

Optionally, the island region 21 may include one virtual quadrilateral A, as shown in FIG. 2 and FIG. 3.

Optionally, the island region 21 may include a plurality of virtual quadrilaterals A, the plurality of virtual quadrilaterals A are arranged along a row direction and/or a column direction, and two adjacent virtual quadrilaterals A share one side edge.

Figure 4:
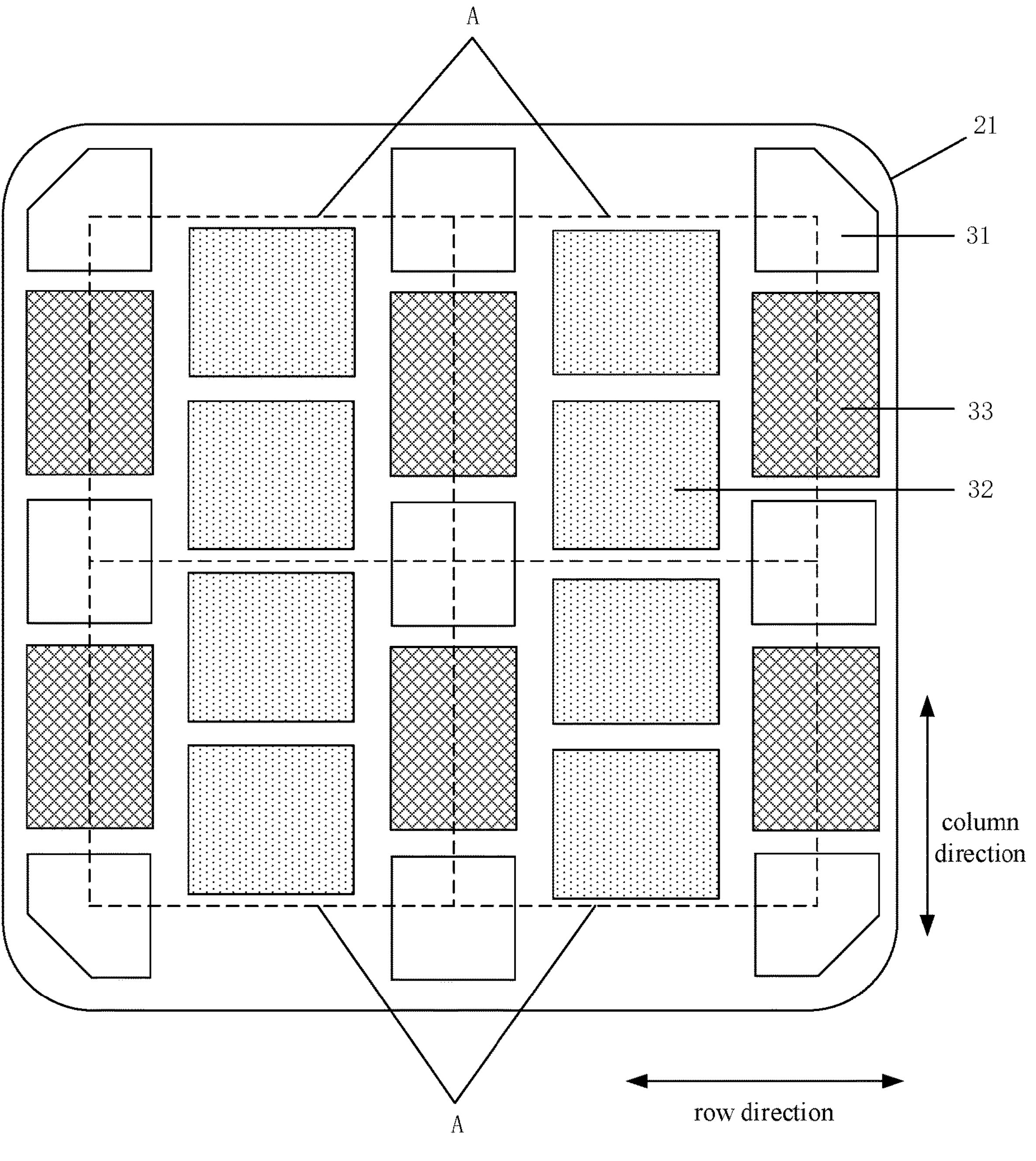
FIG. 4 illustrates a schematic diagram of a pixel structure of a third display substrate according to the present disclosure.

For example, as shown in FIG. 4, the island region 21 includes four virtual quadrilateral A. Among them, two virtual quadrilaterals A are arranged along the row direction, two virtual quadrilaterals A are arranged along the column direction, the two adjacent virtual quadrilaterals A in the row direction share one side edge, and two adjacent virtual quadrilaterals A in the column direction share one side edge.

As shown in FIG. 2 to FIG. 4, and FIG. 7, a shape of the island region 21 is a quadrangle, for the subpixel disposed close to a vertex of the quadrangle, an apex angle close to the vertex of the quadrangle is a chamfer.

Optionally, an apex angle of the quadrangle is a chamfer. Among them, the chamfer may be circular or straight.

By setting the four apex angles of the island region 21 and the apex angles of the subpixels at the corresponding positions to be chamfers, the interference effect of the right-angle luminous area on the ambient light transmitted through the hole regions can be reduced.

Figure 7:
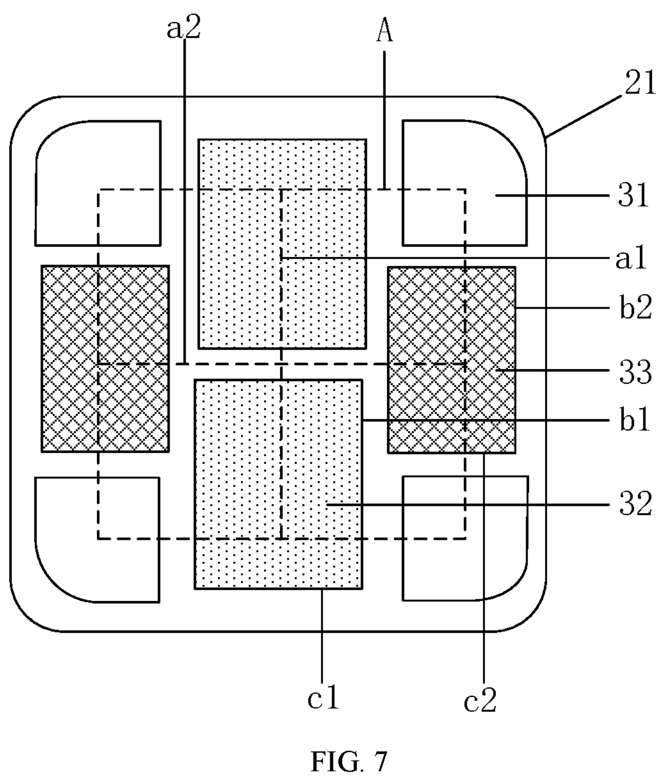
FIG. 7 illustrates a schematic diagram of a pixel structure of a fourth display substrate according to the present disclosure.
Figure 8:
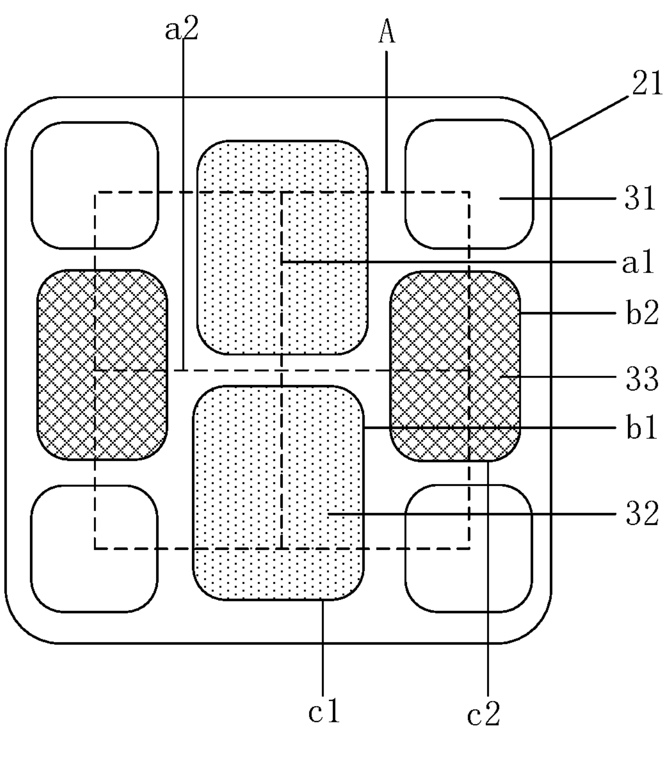
FIG. 8 illustrates a schematic diagram of a pixel structure of a fifth display substrate according to the present disclosure.

In FIG. 2, FIG. 3 and FIG. 7, the island region 21 includes one virtual quadrilateral A. and the subpixels arranged close to the vertexes of the quadrangle in the island region 21 are the four first subpixels 31 located at the vertex positions of the virtual quadrilateral A, and for each first subpixel 31 of the four first subpixels 31, one apex angle close to the vertex of the quadrangle in the island region 21 is the chamfer. The chamfer can be a straight chamfer, as shown in FIG. 2 and FIG. 3; it can also be a circle chamfer, as shown in FIG. 7.

In FIG. 4, the island region 21 includes four virtual quadrilaterals A, the subpixels arranged close to the vertexes of the quadrangle are four first subpixels 31, and for each first subpixel 31 of the four first subpixels 31, one apex angle close to the vertex of the quadrangle in the island region 21 is the chamfer. In FIG. 4, the chamfer is a straight chamfer.

Optionally, as shown in FIG. 1, the display substrate further includes a bridge region 23 connecting adjacent island regions 21.

In the specific implementation, each of the plurality of subpixels is provided with a light-emitting device and a drive circuit. The drive circuit is electrically connected to the light-emitting device and signal lines 24, and configured to drive the light-emitting device to emit light according to signals provided by the signal lines 24.

Optionally, the signal lines 24 are disposed within a range of the bridge region 23.

Among them, the drive circuit is disposed in the subpixel, that is, the subpixel adopts the structure of the built-in drive circuit.

In the specific implementation, the light-emitting devices with different colors can be set in the subpixels with different colors. For example, the red subpixels are provided with red light-emitting devices, the green subpixels are provided with green light-emitting devices, and the blue subpixels are provided with blue light-emitting devices.

Optionally, the drive circuit and light-emitting device can be stacked in the subpixel, and the drive circuit is arranged away from the light-emitting side of the light-emitting device. The drive circuit can include thin-film transistors, capacitors, etc. The light-emitting device mainly includes an anode, an organic light-emitting layer and a cathode that are stacked.

The drive circuit can be connected to the anode of the light-emitting device to provide the anode with a current that drives the light-emitting device to emit light.

When the plurality of island regions 21 are arranged along the first direction and the second direction, as shown in FIG. 1, the bridge region 23 may include a first bridge region 231 and a second bridge region 232, the first bridge region 231 connects two adjacent island regions 21 in a first direction, and the second bridge region 232 connects two adjacent island regions 21 in a second direction.

In the specific implementation, as shown in FIG. 1, the signal lines 24 may include first signal lines 241 and second signal lines 242. The first signal lines 241 may extend along the first direction, and the second signal lines 242 may extend along the second direction.

Optionally, the plurality of first signal lines 241 connected to the drive circuits in a same island region 21 are located in different layers and overlapped with each other in a range of the first bridge region 231.

By setting the plurality of first signal lines 241 connecting the drive circuits in the same island region 21 in different film layers, these first signal lines 241 can be overlapped in the range of the first bridge region 231, thus reducing the space occupation of the first signal lines 241, compressing the area of the first bridge region 231, increasing the area of the hole regions 22, namely, the transparent area, and improving transmittance of the ambient light.

In order to further reduce the area occupation of the first signal lines 241, compress the area of the first bridge regions 231, maximize the area of the transparent hole regions 22. Optionally, the plurality of first signal lines 241 connected to the drive circuits in the same island region 21 completely overlap in the second direction.

Optionally, the plurality of second signal lines 242 connected to the drive circuits in a same island region 21 are located in different layers and overlapped with each other in a range of the second bridge region 232.

By setting the plurality of second signal lines 242 connecting the drive circuits in the same island region 21 in different film layers, these second signal lines 242 can be overlapped in the range of the second bridge region 232, thus reducing the space occupation of the second signal lines 242, compressing the area of the second bridge region 232, increasing the area of the hole regions 22, namely, the transparent area, and improving transmittance of the ambient light.

In order to further reduce the area occupation of the second signal lines 242, compress the area of the second bridge regions 232, maximize the area of the transparent hole regions 22. Optionally, the plurality of second signal lines 242 connected to the drive circuits in the same island region 21 completely overlap in the first direction.

Among them, the first direction may be perpendicular to the second direction.

The first signal lines 241 may include, for example, a data signal line. The second signal lines 242 may include, for example, a gate signal line.

Optionally, the material of the signal lines 24 includes transparent metal oxide or metal.

Specifically, the materials of the first signal lines 241 may include at least one of titanium, aluminum, molybdenum, copper, silver, magnesium, lithium, neodymium, gold, platinum and other metal materials, and may also include at least one of transparent metal oxides such as indium tin oxide (ITO), indium zinc oxide (IZO) and graphene oxide, which is not limited in the embodiment. For example, the material of the first signal line 241 is titanium/aluminum/titanium.

When the material of the first signal line 241 is metal, the resistance of the first signal line 241 can be reduced. Because the first signal lines 241 made of metal materials are opaque, in order to improve the ambient light transmittance of the display substrate, the plurality of first signal lines 241 connected to each drive circuit in the same island region 21 can be set in different film layers and overlapped with each other or completely overlapped within the range of the first bridge region 231, so that the area of the first bridge region 231 can be compressed, thus improving the ambient light transmittance of the display substrate.

When the first signal line 241 is made of transparent metal oxide, due to the light transmission characteristics of the first signal line 241 itself, it can avoid blocking the ambient light, so it can improve the ambient light transmittance.

Specifically, the materials of the second signal lines 242 may include at least one of titanium, aluminum, molybdenum, copper, silver, magnesium, lithium, neodymium, gold, platinum and other metal materials, and may also include at least one of transparent metal oxides such as indium tin oxide (ITO), indium zinc oxide (IZO) and graphene oxide, which is not limited in the embodiment. For example, the material of the second signal line 242 is titanium/aluminum/titanium.

When the material of the second signal line 242 is metal, the resistance of the second signal line 242 can be reduced. Because the second signal lines 242 made of metal materials are opaque, in order to improve the ambient light transmittance of the display substrate, the plurality of second signal lines 242 connected to each drive circuit in the same island region 21 can be set in different film layers and overlapped with each other or completely overlapped within the range of the second bridge region 232, so that the area of the second bridge region 232 can be compressed, thus improving the ambient light transmittance of the display substrate.

When the second signal line 242 is made of transparent metal oxide, due to the light transmission characteristics of the second signal line 242 itself, it can avoid blocking the ambient light, so it can improve the ambient light transmittance.

The present disclosure provides a display device, including any one of the above described display substrates.

Since the display device includes the above display substrate, those skilled in the art can understand that the display device has the advantages of the display substrate provided by the present disclosure, which will not be repeated here.

It should be noted that the display device in the embodiment can be any product or component with 2D or 3D display function, such as display panel, electronic paper, mobile phone, tablet computer, TV, notebook computer, digital photo frame, virtual reality device, augmented reality device, off-screen camera device and navigator.

The present disclosure provides a driving method of a display substrate, which is applied to any one of the above described display substrates, referring to FIG. 5 or FIG. 6. The driving method includes: driving each of the first subpixels 31 to emit light independently, to form four white pixels W in the virtual quadrilateral A, wherein each of the white pixels W includes one of the first subpixels 31, one of the second subpixels 32 and one of the third subpixels 33, and two adjacent white pixels W share the second subpixel 32 and/or the third subpixel 33.

In the specific implementation, for each first subpixel 31, it can be driven independently. The first subpixel 31, and one second subpixel 32 and one third subpixel 33 that are surrounding the first subpixel 31, form a white pixel W. In this way, four white pixels W can be formed in the virtual quadrilateral A.

As shown in FIG. 5, in the virtual quadrilateral A, each first subpixel 31 corresponds to one white pixel W. Each white pixel W in the virtual quadrilateral A can independently include one first subpixel 31. The second subpixel 32 and/or third subpixel 33 can be shared between two adjacent white pixels W in the virtual quadrilateral A.

Specifically, the two white pixels W corresponding to the two adjacent first subpixels 31 can share the second subpixel 32 or the third subpixel 33 between the two adjacent first subpixels 31.

For example, in the virtual quadrilateral A, the white pixel W at the lower right corner (as shown in FIG. a in FIG. 5) and the white pixel W at the lower left corner (as shown in FIG. b in FIG. 5) share the second subpixel 32 between the first subpixel 31 at the lower right corner and the first subpixel 31 at the lower left corner.

In the virtual quadrilateral A, the white pixel W at the upper right corner (as shown in the FIG. c in FIG. 5) and the white pixel W at the upper left corner (as shown in FIG. d in FIG. 5) share the second subpixel 32 between the first subpixel 31 at the upper right corner and the first subpixel 31 at the upper left corner.

In the virtual quadrilateral A, the white pixel W at the lower right corner (as shown in FIG. a in FIG. 5) and the white pixel W at the upper right corner (as shown in FIG. c in FIG. 5) share the third subpixel 33 between the first subpixel 31 at the lower right corner and the first subpixel 31 at the upper right corner.

In the virtual quadrilateral A, the white pixel W at the lower left corner (as shown in FIG. b in FIG. 5) and the white pixel W at the upper left corner (as shown in FIG. d in FIG. 5) share the third subpixel 33 between the first subpixel 31 at the lower left corner and the first subpixel 31 at the upper left corner.

During the display process, the luminance center of each white pixel W forms a white luminance center C (as shown in FIG. 5).

Because the spacing between the first subpixels 31 is relatively large and the distribution of the first subpixels 31 in the virtual quadrilateral A is relatively scattered, the first subpixels 31 can be set as a color subpixel with strong human eye perception or high human eye sensitivity (such as the green subpixel, etc.). Because of the high dispersity of the first subpixels 31, the dispersity of the white luminance center C formed by the mixing of the first sub-pixel 31, and the second sub-pixel 32 and the third sub-pixel 33 in the island region 21 is also improved, which improves the distribution uniformity of the white luminance center C in the island region 21, and avoids the local aggregation of the white luminance center C in the island region 21, which is equivalent to increasing the number of the white luminance centers C in the island region 21, thus improving the fineness of the display image.

In addition, because the distribution of the white luminance center C in the island region 21 is more uniform, and the white luminance center C is also distributed at the edge of the island region 21, the spacing between the two white luminance centers C located on the adjacent island regions 21 can be reduced (as shown in FIG. 6), thus reducing the dark area spacing between adjacent island regions 21 and reducing the graininess of the display image.

Each embodiment in this specification is described in a progressive manner. Each embodiment focuses on the differences from other embodiments. The same and similar parts between each embodiment can be referred to each other.

Finally, it should also be noted that in this specification, relational terms such as the first and second are only used to distinguish one entity or operation from another entity or operation, and do not necessarily require or imply any such actual relationship or order between these entities or operations. Moreover, the terms "comprising". "including" or any other variation thereof are intended to cover non-exclusive inclusion, so that a process, method, commodity or equipment that includes a series of elements not only includes those elements, but also includes other elements that are not explicitly listed, or also includes elements inherent in such process, method, commodity or equipment. In the absence of further restrictions, the elements defined by the statement "including a . . . " do not exclude the existence of other identical elements in the process, method, commodity or equipment including the elements.

The above describes a display substrate, a driving method of the display substrate and a display device provided by the present disclosure in detail. Specific examples are used to illustrate the principles and implementation of the present disclosure. The above examples are only used to help understand the methods and core ideas of the present disclosure. At the same time, for those skilled in the art, according to the idea of the present disclosure, there will be changes in the specific implementation mode and application scope. To sum up, the content of this specification should not be understood as a limitation of the present disclosure.

Those skilled in the art will easily think of other embodiments of the present disclosure after considering the specification and practicing the invention disclosed herein. The present disclosure is intended to cover any variant, use or adaptive change of the present disclosure. These variants, uses or adaptive changes follow the general principles of the present disclosure and include the common knowledge or commonly used technical means in the technical field not disclosed in the present disclosure. The specification and the embodiments are only regarded as illustrative. The true scope and spirit of the present disclosure are indicated by the following claims.

It should be understood that the present disclosure is not limited to the precise structure described above and shown in the drawings, and various modifications and changes can be made without departing from its scope. The scope of the present disclosure is limited only by the appended claims.

The "one embodiment". "embodiments" or "one or more embodiments" mentioned herein means that the specific features, structures or features described in combination with the embodiments are included in at least one embodiment of the present disclosure. In addition, please note that the word "in one embodiment" does not necessarily refer to the same embodiment.

A large number of specific details are described in the specification provided here. However, it can be understood that the embodiments of the present disclosure can be practiced without these specific details. In some examples, the well-known methods, structures and techniques are not shown in detail so as not to obscure the understanding of this specification.

In the claims, any reference symbol between brackets shall not be constructed as a restriction on the claims. The word "comprising" does not exclude the existence of elements or steps not listed in the claims. The word "an/a" or "one" before a component does not exclude the existence of multiple such components. The present disclosure can be realized by means of hardware including several different elements and by means of a properly programmed computer. In the unit claims that list several devices, several of these devices can be embodied by the same hardware item. The use of the words such as first, second, and third does not indicate any order. These words can be interpreted as names.

Finally, it should be noted that the above embodiments are only used to illustrate the technical solution of the present disclosure, not to limit it. Although the present disclosure has been described in detail with reference to the preceding embodiments, those skilled in the art should understand that they can still modify the technical solutions recorded in the preceding embodiments or replace some of the technical features equally. These modifications or substitutions do not make the essence of the corresponding technical solutions separate from the spirit and scope of the technical solutions of the embodiments of the present disclosure.

The invention claimed is:

1. A display substrate, comprising a plurality of island regions separated from each other, and hole regions located between adjacent island regions, wherein:

each of the plurality of island regions comprises a plurality of subpixels, the plurality of subpixels comprise first subpixels, second subpixels and third subpixels; the first subpixels are located at four vertex positions of a virtual quadrilateral; the second subpixels and the third subpixels are located at positions of two center lines of the virtual quadrilateral, and the third subpixels are located at two opposite side edges of the virtual quadrilateral, to separate adjacent first subpixels; each of the center lines is a connecting line between midpoints of a pair of opposite side edges of the virtual quadrilateral;

a ratio of a quantity of the first subpixels, a quantity of the second subpixels and a quantity of the third subpixels within the virtual quadrilateral is 4:2:2;

shapes of the plurality of subpixels in the virtual quadrilateral are configured so that the plurality of subpixels are axially symmetric with respect to two center lines of the virtual quadrilateral in the row direction and the column direction, and are centrosymmetric with respect to a center point of the virtual quadrilateral, wherein each of the two center lines of the virtual quadrilateral is a connecting line between midpoints of a pair of opposite side edges of the virtual quadrilateral, and the center point refers to an intersection point of the two center lines of the virtual quadrilateral;

one corner of each of the first subpixels that is located at one of the vertex positions of the virtual quadrilateral is a tapered part or a chamfer, and a straight connecting line extending in the row direction or the column direction between tapered positions or chamfered positions of the corners of two instances of the first subpixels in a same row or a same column does not pass through the second subpixel or the third subpixel that is located between the two first subpixels; and the island region comprises a plurality of virtual quadrilaterals, the plurality of virtual quadrilaterals are arranged along a row direction and/or a column direction, and two adjacent virtual quadrilaterals share one side edge.

2. The display substrate according to claim 1, wherein the two center lines comprise a first center line and a second center line; in the virtual quadrilateral, at least one of the second subpixels is arranged in sequence along the first center line, and the third subpixels are located on the second center line and symmetrically arranged on two sides of the second subpixel.

3. The display substrate according to claim 2, wherein in the virtual quadrilateral, the third subpixels are not adjacent to each other.

4. The display substrate according to claim 3, wherein each of the second subpixels has at least a first long side and a first short side, the first long side is parallel to the first center line, and the first short side is parallel to the second center line; and/or, each of the third subpixels has at least a second long side and a second short side, the second long side is parallel to the first center line, and the second short side is parallel to the second center line.

5. The display substrate according to claim 4, wherein the shapes of the first subpixels are a square, and the shapes of the second subpixels and the third subpixels are a rectangle;

wherein, one pair of opposite side edges of the square are parallel to the first center line, and the other pair of opposite side edges are parallel to the second center line.

6. The display substrate according to claim 5, wherein two second subpixels and two third subpixels are provided in the virtual quadrilateral.

7. The display substrate according to claim 3, wherein for the first subpixel and the second subpixel arranged adjacently, a side edge of the first subpixel close to the second subpixel is parallel to a side edge of the second subpixel close to the first subpixel; and/or, for the first subpixel and the third subpixel arranged adjacently, a side edge of the first subpixel close to the third subpixel is parallel to a side edge of the third subpixel close to the first subpixel; and/or, for the second subpixel and the third subpixel arranged adjacently, a side edge of the second subpixel close to the third subpixel is parallel to a side edge of the third subpixel close to the second subpixel.

8. The display substrate according to claim 1, wherein the shapes of the plurality of subpixels comprise at least one of: a polygon, an oval, a sector, a kidney shape and a runway shape.

9. The display substrate according to claim 1, wherein a minimum distance between two adjacent subpixels is greater than or equal to 10 μm, and less than or equal to 30 μm.

10. The display substrate according to claim 1, wherein the first subpixels are green subpixels, the second subpixels are blue subpixels, and the third subpixels are red subpixels; or, the first subpixels are the green subpixels, the second subpixels are the red subpixels, and the third subpixels are the blue subpixel.

11. The display substrate according to claim 1, wherein a ratio among the area of the red subpixels, the area of the green subpixels and the area of the blue subpixels is 2:1.5:5.

12. The display substrate according to claim 1, wherein a shape of the island region is a quadrangle, for the subpixel disposed close to a vertex of the quadrangle, an apex angle close to the vertex of the quadrangle is a chamfer, and an apex angle of the quadrangle is a chamfer.

13. The display substrate according to claim 1, wherein the display substrate further comprises a bridge region connecting adjacent island regions, each of the plurality of subpixels is provided with a light-emitting device and a drive circuit; the drive circuit is electrically connected to the light-emitting device and signal lines, and configured to drive the light-emitting device to emit light according to signals provided by the signal lines;

wherein, the signal lines are disposed within a range of the bridge region.

14. The display substrate according to claim 13, wherein the bridge region comprises a first bridge region and a second bridge region, the first bridge region connects two adjacent island regions in a first direction, and the second bridge region connects two adjacent island regions in a second direction; and the signal lines comprise first signal lines and second signal lines, the first signal lines extend along the first direction, and the second signal lines extend along the second direction.

15. The display substrate according to claim 13, wherein materials of the signal lines comprise transparent metal oxide or metal.

16. A display device, comprising the display substrate according to claim 1.

17. A driving method of a display substrate, applied to the display substrate according to claim 1, wherein the driving method comprises:

driving each of the first subpixels to emit light independently, to form four white pixels in the virtual quadrilateral, wherein each of the white pixels comprises one of the first subpixels, one of the second subpixels and one of the third subpixels, and two adjacent white pixels share the second subpixel and/or the third subpixel.

18. The display substrate according to claim 1, wherein an area of red subpixels is greater than or equal to an area of green subpixels, and less than an area of blue subpixels.

* * * * *